United States Patent
Piastowski et al.

(10) Patent No.: US 9,678,171 B2
(45) Date of Patent: Jun. 13, 2017

(54) METHOD AND DEVICE FOR ACQUIRING AT LEAST ONE SIGNAL

(71) Applicant: Robert Bosch GmbH, Stuttgart (DE)

(72) Inventors: Martin Piastowski, Schwieberdingen (DE); Burkhard Triess, Ludwigsburg (DE); Patrick Nickel, Birstein (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/167,266

(22) Filed: Jan. 29, 2014

(65) Prior Publication Data

US 2014/0210459 A1    Jul. 31, 2014

(30) Foreign Application Priority Data

Jan. 30, 2013    (DE) .................. 10 2013 201 458

(51) Int. Cl.
G01R 33/02    (2006.01)
G01R 29/00    (2006.01)
G01R 29/08    (2006.01)

(52) U.S. Cl.
CPC ............ *G01R 33/02* (2013.01); *G01R 29/00* (2013.01); *G01R 29/0871* (2013.01)

(58) Field of Classification Search
CPC ........ G01R 33/02; G01R 29/00; G01R 27/26; G01R 1/06; G01N 27/82; G06F 3/044
See application file for complete search history.

(56) References Cited

U.S. PATENT DOCUMENTS

| | | | |
|---|---|---|---|
| 5,959,449 A * | 9/1999 | Winkler | G01R 15/18 324/117 R |
| 7,317,319 B2 * | 1/2008 | Kazama | G01R 33/025 324/632 |
| 2005/0046621 A1* | 3/2005 | Kaikuranta | 345/173 |
| 2005/0110768 A1* | 5/2005 | Marriott et al. | 345/173 |
| 2007/0016007 A1* | 1/2007 | Govari et al. | 600/424 |
| 2007/0157828 A1* | 7/2007 | Susel et al. | 101/35 |
| 2007/0168118 A1* | 7/2007 | Lappe | G01C 21/005 701/408 |
| 2009/0146847 A1* | 6/2009 | Barkeloo | H03K 17/9622 341/20 |
| 2009/0278534 A1* | 11/2009 | Kahlman | B82Y 25/00 324/252 |
| 2010/0130134 A1* | 5/2010 | Tamura et al. | 455/63.1 |
| 2011/0074705 A1* | 3/2011 | Yousefpor et al. | 345/173 |
| 2011/0210750 A1* | 9/2011 | Medelius | H01B 1/04 324/543 |

(Continued)

OTHER PUBLICATIONS

Al-Dhahir, N. et al., "The Finite-Length Multi-Input Multi-Output MMSE-DFE," *IEEE Transactions of Signal Processing*, vol. 48, No. 10, pp. 2921-2936 (Oct. 2000).

*Primary Examiner* — Huy Q Phan
*Assistant Examiner* — Alvaro Fortich
(74) *Attorney, Agent, or Firm* — Gerard Messina

(57) ABSTRACT

A method for acquiring at least one signal transmitted via an electric conductor, wherein an electric and/or magnetic field of the conductor is acquired at at least two identical or different positions relative to a longitudinal coordinate of the conductor, thus obtaining two measurement signals corresponding to the respective positions, and the signal transmitted via the conductor is inferred from the measurement signals.

18 Claims, 2 Drawing Sheets

(56) References Cited

U.S. PATENT DOCUMENTS

| | | | |
|---|---|---|---|
| 2011/0235851 A1* | 9/2011 | Setlur | H04L 12/58 |
| | | | 382/100 |
| 2012/0327261 A1* | 12/2012 | Tafazoli Bilandi | E02F 9/24 |
| | | | 348/222.1 |
| 2013/0106720 A1* | 5/2013 | Shahparnia | G06F 1/26 |
| | | | 345/173 |
| 2013/0211750 A1* | 8/2013 | Garnacho Vecino | G01R 31/1272 |
| | | | 702/59 |
| 2014/0267165 A1* | 9/2014 | Roziere | G06F 3/044 |
| | | | 345/174 |

* cited by examiner

METHOD AND DEVICE FOR ACQUIRING AT LEAST ONE SIGNAL

CROSS REFERENCE

The present application claims the benefit under 35 U.S.C. §119 of German Patent Application No. DE 102013201458.9 filed on Jan. 30, 2013, which is expressly incorporated herein by reference in its entirety.

FIELD

The present invention relates to a method for acquiring at least one signal that is transmitted via an electric conductor. The present invention further relates to a device for acquiring at least one signal transmitted via an electric conductor.

BACKGROUND INFORMATION

In conductors that enable a data transmission according to the Ethernet standard, so-called Ethernet taps are looped into the conductors that are used to observe the data traffic on the Ethernet line. Disadvantageously, such Ethernet taps require a physical manipulation of the conductor, in particular the looping of the tap into the conductor. Moreover, the named Ethernet taps can have significant effects on the signal transmission (for example due to delay, distortion, and attenuation) within the conductor.

SUMMARY

An object of the present invention is to improve a method and a device in such a way that there is no influence, or as little influence as possible, on the signals transmitted via the conductor, and a relatively low expense is required to acquire the signal.

According to an example embodiment of the present invention, in the example method, this object may be achieved in that an electric and/or magnetic field of the conductor is acquired at at least two identical or different positions relative to a longitudinal coordinate of the conductor, thereby obtaining two measurement signals corresponding to the respective positions, and that the signal transmitted via the conductor is inferred from the measurement signals.

According to the present invention, the measurement signals obtained from the electric and/or magnetic and/or electromagnetic fields of the conductor contain information concerning signals transmitted on the conductor that can be reconstructed given corresponding signal processing, so that no physical intervention is required in the conductor, for example in individual wire pairs of the conductor, in order to obtain information concerning the signals transmitted on the conductor. In a specific embodiment, the acquisition can take place at a single position; in this case, preferably at least two field quantities (electric field and magnetic field) are then acquired. In a further specific embodiment, the acquisition can also take place at at least two different positions; in this case, the measurement of one field quantity is sufficient.

Accordingly, the example design according to the present invention enables a contactless acquisition of information concerning the signals transmitted in the conductor in the form of the electric and/or magnetic and/or electromagnetic fields, representing a combination of electric and magnetic fields. Correspondingly, it can be provided according to the present invention to acquire an electric and/or magnetic and/or electromagnetic field as a combination of the field components of the conductor at the plurality of positions. It is also possible for fields of different types to be acquired at different positions. For example, at a first and third position an electric field and a magnetic field can be acquired, while at a second position only, for example, an electric field is acquired. Other combinations are also possible.

In a preferred specific embodiment, it is provided that from the measurement signals there is inferred a plurality of signals transmitted via the conductor, in particular a first signal transmitted in a first direction along the longitudinal coordinate and a second signal transmitted in a second direction opposite to the first direction.

According to the present invention, it is accordingly even possible to evaluate bidirectional data transmissions on the conductor in such a way that the respective signals associated with the different directions of communication can be isolated. For this purpose, the provision of at least two measurement taps is required at the at least two different positions along the conductor.

In a further advantageous specific embodiment, it is provided that a multidimensional equalization is applied in order to infer the signal or signals. Because the measurement signals obtained according to the present invention, assigned to the various positions of the conductor, at first represent a superposition of the individual electromagnetic waves of data communications running back and forth on the conductor, according to the present invention the multidimensional equalization is proposed in order to isolate the individual signals of the relevant communication directions from one another.

In a further advantageous specific embodiment, it is provided that for the acquisition of the electric and/or magnetic and/or electromagnetic field as a combination of the field components of the conductor, discrete and/or distributed inductive and/or capacitive coupling elements are used.

Particularly advantageously, the example method according to the present invention can be used to carry out an analysis of a data communication between at least two data nodes connected to one another via the conductor. For example, the data nodes can be control devices of a motor vehicle, in particular of an internal combustion engine of a motor vehicle, and the like. In a specific embodiment, a data communication having digital signals can preferably be acquired.

A further aspect of the present invention includes an example method for acquiring at least one signal transmitted via an electric conductor in which an electric and/or magnetic field of the conductor is acquired only at one position relative to a longitudinal coordinate of the conductor, thereby obtaining a measurement signal corresponding to the position, the signal or plurality of signals transmitted via the conductor being inferred from the measurement signal.

A further aspect of the present invention includes an example method for acquiring at least one signal transmitted via an electric conductor, a direct coupling to the line being used for the measurement of line current and/or line voltage instead of the acquisition of the electric and/or magnetic field of the conductor.

As a further solution of the object of the present invention, an example device is possible.

The example device is fashioned to acquire an electric and/or magnetic field of the conductor at at least two identical or different positions relative to a longitudinal coordinate of the conductor, thereby obtaining two measurement signals corresponding to the respective positions, and from the measurement signals to infer the signal transmitted via the conductor.

In an advantageous specific example embodiment, it is provided that the device is fashioned to infer from the measurement signals a plurality of signals transmitted via the conductor, in particular a first signal transmitted in a first direction along the longitudinal coordinate and a second signal transmitted in a second direction opposite to the first direction.

In a further advantageous specific example embodiment, it is provided that the device is fashioned to apply an equalization, preferably a multidimensional one, to the signal or signals.

The equalization can, for example, include a filtering of one or more of the measurement signals obtained according to the present invention, a low-pass filtering or a bandpass filtering or a high-pass filtering being in particular possible. In addition, it is possible in the context of the equalization according to the present invention to combine the measurement signals, or filtered measurement signals derived from the measurement signals, with one another such that they are weighted with different weighting factors, or are temporally delayed relative to one another, and are manipulated in other ways, for example by additions.

In an advantageous specific example embodiment, the possible equalization is carried out in three steps, as follows:
1) Channel estimation of matrix-valued impulse responses (multi-input multi-output (MIMO) transmission channel) on the basis of training sequences that are sent in temporally offset fashion and are contained in the signals transmitted on the conductor. Here, the MIMO transmission channel is made up of the individual channels from all individual transmit devices to all individual measurement taps of the signals.
2) On the basis of the channel impulse responses, using pre-filtering the signal energy can be concentrated (shortening of the impulse responses), and the sent individual signals can be completely or partially decoupled. A possible filter calculation algorithm for the equalization on the basis of a multi-input multi-output (MIMO) minimum mean-square error (MMSE) decision-feedback equalization (DFE) is described in: N. Al-Dhahir, A. H. Sayed, "The Finite-Length Multi-Input Multi-Output MMSE-DFE," IEEE Transactions on Signal Processing, vol. 48, no. 10, pp. 2921-2936, October 2000.
3) After filtering of the measurement signals, an equalization is carried out on the basis of decision-feedback equalization (DFE) or state-based equalization, and the signal or signals are inferred.

In a further specific example embodiment, it is provided that the device has at least two discrete and/or distributed inductive and/or capacitive coupling elements for acquiring the electric and/or magnetic field, or the electromagnetic field, as a combination of the field components of the conductor at the at least two different positions of the conductor. The coupling elements can for example be provided in the form of one or more clips that can be clipped onto an existing conductor.

In a further advantageous specific example embodiment, it is provided that at least one coupling element has at least one of the following elements: coil, capacitor, coupling line, antenna.

In a further advantageous specific example embodiment, it is provided that at least one coupling element has at least one of the following elements: direct clipping into the cable guiding of the conductor by cable or directional coupler.

In a further specific example embodiment, it is provided that the conductor is coupled or contacted by the device directly in low-ohmic fashion in order to couple out current and voltage that are on the line. Here, it is also possible to make a separation of the line for the direct measurement of the current signal and a contact on the conductor wires for the direct measurement of the voltage signal. From the current and voltage, the signals of both line directions can be reconstructed as an estimated signal in the same form as presented above, for example via multidimensional equalization. This low-ohmic coupling can be carried out as an alternative to field acquisition or as a supplement thereto.

Further features, possible applications, and advantages of the present invention result from the following description of exemplary embodiments of the present invention, shown in the Figures. Here, all described or presented features form the subject matter of the present invention, in themselves or in arbitrary combination, independent of their formulation or presentation in the description below or in the figures.

DETAILED DESCRIPTION OF EXAMPLE EMBODIMENTS

Figure 1:
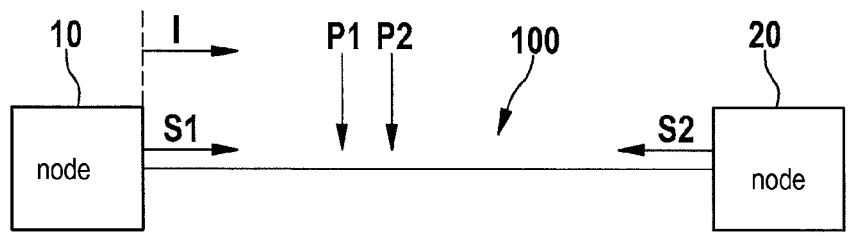
FIG. 1 schematically shows a block diagram of a specific embodiment of the present invention.
Figure 1:
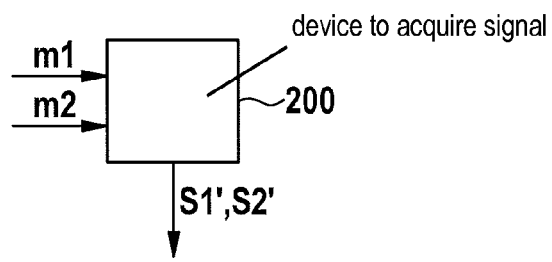

FIG. 1 schematically shows a block diagram of a first specific embodiment of the present invention. A first data node or communication node 10, which can be for example a control device of a motor vehicle or the like, is connected to a second communication node 20 via a conductor 100. Conductor 100 can for example have a pair of electric wires for the transmission of electric signals. Other configurations are also possible for conductor 100.

The two communication nodes 10, 20 are fashioned to transmit corresponding signals s1, s2 via conductor 100. A first signal s1 is transmitted by first communication node 10 via conductor 100 to second communication node 20. A second signal s2 is transmitted by second communication node 20 via conductor 100 to first communication node 10. A longitudinal coordinate of conductor 100 is indicated schematically in FIG. 1 by the arrow designated with reference character I. First signal s1 from first communication node 10 is thus transmitted in a first direction of communication along longitudinal coordinate I, whereas second signal s2 is transmitted by second communication node 20 in the direction opposite thereto.

According to an example embodiment of the present invention, a device 200 is provided for acquiring at least one signal s1, s2 transmitted via electric conductor 100.

According to a specific example embodiment, device 200 is fashioned to acquire an electric and/or magnetic and/or electromagnetic field as a combination of the field components of conductor 100 at at least two different positions p1, p2 (or more) relative to longitudinal coordinate I of conductor 100. This takes place for example using coupling elements fashioned as a coil or capacitor or coupling line or antenna, not shown in FIG. 1 for the sake of clarity.

According to a further specific example embodiment, the acquisition of an electric and of a magnetic field of the conductor is possible at the same position p1, as is a measurement of current and voltage at the same position. In these variants, measurements therefore need not be made at a plurality of different positions.

Through the above-described acquisition of the relevant fields, or of the relevant field, of conductor 100 at the different positions p1, p2, at least two measurement signals m1, m2 corresponding to the respective positions p1, p2 are obtained. According to an example embodiment of the present invention, device 200 is fashioned to infer, from measurement signals m1, m2, signal s1, s2 transmitted via conductor 100.

In those variants of the present invention in which electric and magnetic fields, or current and voltage, are measured at only one position, these two measurement quantities of the same position form measurement signals m1, m2.

Particularly advantageously, for the above-indicated acquisition according to the present invention of signals s1, s2 by field measurement, no physical modification of conductor 100 is required. Due to the measurement of the electric field, or of the magnetic field, or of the electromagnetic field, or of an arbitrary combination thereof, by the coupling elements according to the example embodiment of the present invention, the acquisition according to the present invention can take place completely free of contact with regard to conductor 100.

Alternatively or in addition, the conductor can also be coupled or contacted in low-ohmic fashion directly by the device in order to couple out current and voltage that are on the line. Here, a separation of the line for the direct measurement of the current signal and a contact to the line wires for the direct measurement of the voltage signal are also possible. From the current and the voltage, the signals of both line directions can be reconstructed as an estimated signal in the same form as in the case of the field measurement, for example via multidimensional equalization. This low-ohmic coupling can be carried out as an alternative to field acquisition or as a supplement thereto.

In a preferred specific embodiment, device 200 has for example a computing unit that derives from the measurement signals m1, m2 reconstructed signals s1', s2' that generally correspond to signals s1, s2 transmitted via conductor 100. The computing unit can be fashioned for example as a digital signal processor or microcontroller, or also in the form of an ASIC or FPGA. Particularly preferably, in the case of a bidirectional communication as is given in the present case by signals s1, s2, device 200 is also fashioned to isolate the individual signals s1, s2, which have different directions of propagation, in the context of the acquisition and evaluation according to the present invention, so that despite a superposition of signals s1, s2 in the region of conductor 100 the individual signals, or their corresponding estimated signals s1', s2', are available at the output of device 200.

Figure 2:
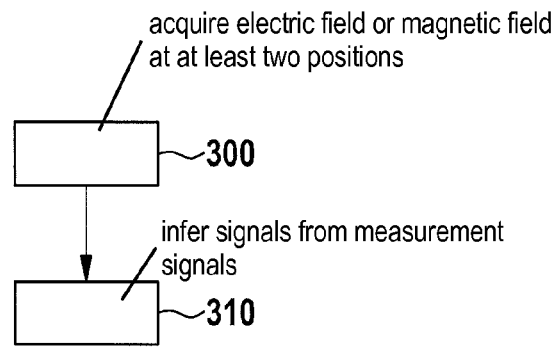
FIG. 2 schematically shows a simplified flow diagram of a specific embodiment of the present invention.

FIG. 2 shows a simplified flow diagram of a specific embodiment of the method according to the present invention. In a first step 300, the above-described acquisition of the electric field or of the magnetic field or of the electromagnetic field takes place at at least two different positions p1, p2 of conductor 100.

In a following step 310, there takes place the evaluation according to the present invention, in which signals s1, s2 are inferred from measurement signals m1, m2, thereby yielding estimated signals s1', s2'. According to a specific embodiment, evaluation 310 can for example include the following steps:

1) Channel estimation of matrix-valued impulse responses (multi-input multi-output (MIMO) transmission channel) on the basis of training sequences that are sent via the conductor in temporally offset fashion and are contained in the signals transmitted on the conductor. Here, the MIMO transmission channel is made up of the individual channels from all individual transmit devices to all individual measurement taps of the signals. A priori knowledge of protocols used for the data transmission and the like can also be used to carry out the channel estimation or to make it more precise.

2) On the basis of the channel impulse responses obtained through the channel estimation, using pre-filtering the signal energy can be concentrated (shortening of the impulse responses), and the sent individual signals can be completely or partially decoupled. A possible filter calculation algorithm for the equalization on the basis of a multi-input multi-output (MIMO) minimum mean-square error (MMSE) decision-feedback equalization (DFE) is described in: N. Al-Dhahir, A. H. Sayed, "The Finite-Length Multi-Input Multi-Output MMSE-DFE," IEEE Transactions on Signal Processing, vol. 48, no. 10, pp. 2921-2936, October 2000.

3) After filtering of the measurement signals, an equalization is carried out on the basis of decision-feedback equalization (DFE) or state-based equalization, and the signal or signals are inferred.

Figure 3:
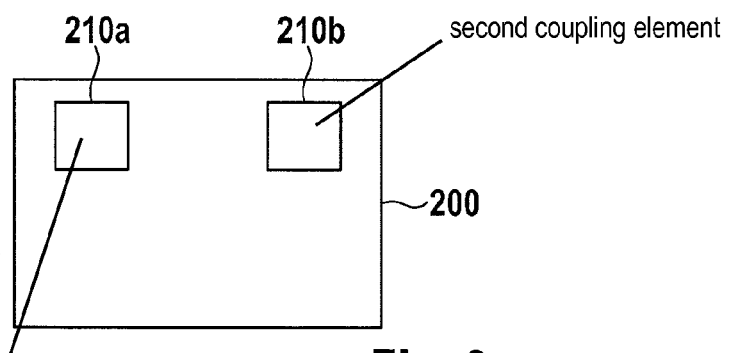
FIG. 3 schematically shows a block diagram of a further specific embodiment of the present invention.

FIG. 3 shows a simplified block diagram of a further specific embodiment of the device according to the present invention. Device 200 has a first coupling element 210a and a second coupling element 210b. Coupling elements 210a, 210b can for example be situated at positions p1, p2, indicated by the arrows in FIG. 1, along longitudinal coordinate I of conductor 100, and are used to receive measurement signals m1, m2 from which, as described above, device 200 reconstructs signals s1, s2 in the form of estimated signals s1', s2'.

Coupling elements 210a, 210b can for example have a coil or a capacitor, or also a coupling line or an antenna or the like, or also a combination thereof or of a plurality of the named elements. In addition, a filter can advantageously already be provided in order to carry out a low-pass filtering or a bandpass filtering or a high-pass filtering in coupling elements 210a, 210b, in order to simplify the signal processing in device 200.

In a further specific embodiment of the present invention, after evaluation 310 (FIG. 2), which results in reconstructed signals s1', s2', a higher-order further evaluation can be carried out that for example analyzes signals s1' s2' according to the communication protocols used. From this, for example the content of individual data packets, or corresponding head data or useful data, can be inferred.

Particularly preferably, the present invention is applicable to conductors having at least one substantially unshielded cable. For example, conductor 100 can have one or more wire pairs of so-called twisted-pair cables, for which a field gradient exists outside the cable or conductor 100. As described above, this can be acquired and analyzed using device 200 according to the present invention and coupling elements 210a, 210b associated therewith.

Figure 4:
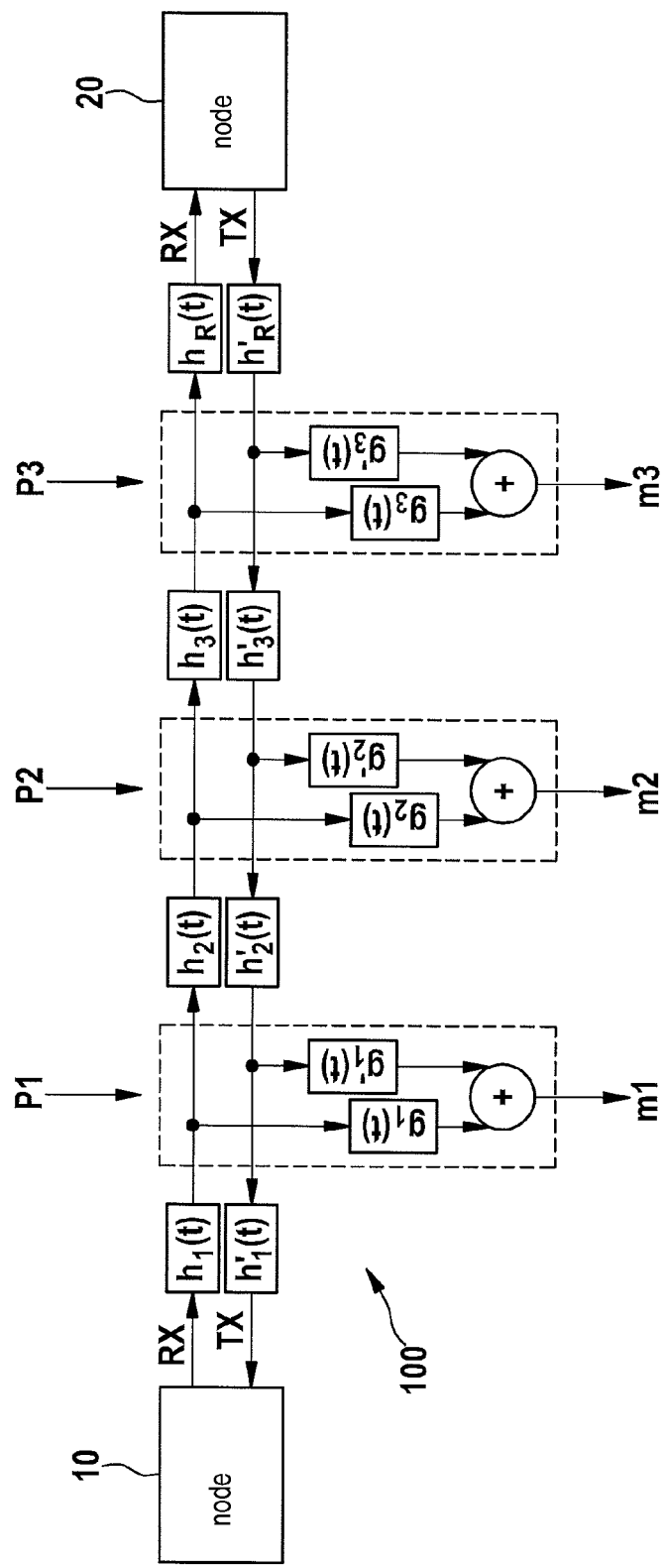
FIG. 4 schematically shows a signal model according to a specific embodiment of the present invention.

FIG. 4 shows a corresponding signal model for a communication scenario with two communication nodes 10, 20, comparable to the schematic representation of FIG. 1. Differing from FIG. 1, the signal model of FIG. 4 provides a total of three different positions p1, p2, p3 for the acquisition of fields of conductor 100 for obtaining measurement signals m1, m2, m3.

A signal transmission direction from first data node 10, or to second data node 20, corresponding essentially to signal s1 of FIG. 1, is designated RX in FIG. 4. A data communication in the opposite direction is designated TX in FIG. 4, and corresponds essentially to signal s2 of FIG. 1.

According to the present invention, coupling elements of device 200 (FIG. 3) are provided at the three positions p1, p2, p3 in order to acquire at least one electric field or magnetic field or electromagnetic field as a combination of the field components therefrom. The transmission functions—generally unknown at first—of the individual line segments of conductor 100 for the two signals RX, TX between nodes 10, 20, or between the three measurement positions p1, p2, p3 along conductor 100, are symbolized in FIG. 4 by $h_1(t)$, $h_2(t)$, $h_3(t)$, and $h_R(t)$, or $h'_1(t)$, $h'_2(t)$, $h'_3(t)$, $h'_R(t)$.

The further transmission functions $g_1(t)$ and $g'_1(t)$ here represent a transmission path (conditioned inter alia by free space damping, the geometry of the coupling out, etc.) from conductor 100 to the coupling element allocated to first position p1. The summation unit, not shown in more detail in FIG. 4, to which the output quantities of transmission functions $g_1(t)$ and $g'_1(t)$ are supplied illustrates the fact that the field quantities acquired at position p1, from which measurement signal m1 is obtained, represent a superposition of two signals RX, TX, or of signals derived therefrom. The same holds for the further transmission functions $g_2(t)$, $g'_2(t)$ at position p2 and $g'_3(t)$ at position p3.

In a further advantageous specific embodiment, through the use of iron cores in coils contained in the coupling elements ferromagnetic properties can be used to increase the permeability and thus also the magnetic flux density in the coil.

In a further specific embodiment, using coils a higher sensitivity for the acquisition of the measurement signals can be achieved than with capacitors, so that given the sole use of an inductive coupling to conductor 100, a distributed configuration of coils at various measurement locations p1, p2, . . . , on the line, preferably with as large a spacing as possible, is useful in order in this way to reduce the correlation of the measurement signals.

As described above, through the field acquisition or measurement according to the present invention measurement signals m1, m2, . . . , are obtained, which generally represent a summation signal of superposed signal components of both directions of transmission of the signals transmitted via conductor 100. The individual coupling elements used for measurement value recording of measurement signals m1, m2, . . . , are correspondingly preferably attached with a corresponding spacing from one another along longitudinal coordinate l (FIG. 1) of conductor 100. The spacing can for example be from a few millimeters to a few centimeters, or also a few tens of centimeters, and generally is selected as a function of the transmission properties of the conductor and coupling elements, or of the frequencies of the transmitted signals s1, s2.

Particularly advantageously, various areas of use of the design of the present invention are possible; in particular, in addition to a use for Ethernet-based communications (in various embodiments, inter alia automotive Ethernet, fast Ethernet, gigabit Ethernet), an application for CAN (Controller Area Network) and FlexRay are also conceivable.

Through the connection of a plurality of measurement points, or plurality of devices 200, according to a further specific embodiment analyses of individual network elements 10, 20 can be prepared. For example, given a corresponding measurement design, all incoming and outgoing communication paths of a component 10, 20 can be simultaneously monitored, or in general a plurality of points in a communication network, which can also include more than two nodes 10, 20, can be measured synchronously.

In a further specific embodiment, for the coupling out of the measurement signals, in addition to coils and capacitors at one or more points in the line it is also possible to use distributed elements such as parallel lines, or other line structures such as antennas, for the coupling out.

What is claimed is:

1. A method for acquiring at least one signal transmitted via an electric conductor, comprising:
    acquiring information concerning the signal transmitted via the conductor by obtaining two measurement signals that represent at least one of: i) an electric field, and ii) a magnetic field, of the conductor at at least two positions relative to a longitudinal coordinate of the conductor, the measurement signals being different than the signal transmitted via the conductor and the measurement signals not being transmitted through the conductor; and
    inferring the signal transmitted via the conductor from the measurement signals, wherein a plurality of signals transmitted via the conductor are inferred from the measurement signals, the plurality of signals including a first signal transmitted in a first direction along the longitudinal coordinate and a second signal transmitted in a second direction opposite the first direction.

2. The method as recited in claim 1, wherein the at least two positions are identical.

3. The method as recited in claim 1, wherein the at least two positions are different.

4. The method as recited in claim 1, wherein a multidimensional equalization is applied to infer the signal.

5. The method as recited in claim 1, wherein coupling elements are used for the acquisition of the at least one of the electric field, and the magnetic field, of the conductor, the capacitive elements being at least one of: i) discrete coupling elements, ii) inductive coupling elements, and iii) capacitive coupling elements.

6. A method for analysis of a data communication between at least two data nodes connected to one another via a conductor, the method comprising:
    acquiring information concerning the signal transmitted via the conductor by obtaining two measurement signals that represent at least one of: i) an electric field, and ii) a magnetic field, of the conductor at at least two positions relative to a longitudinal coordinate of the conductor, the measurement signals being different than the signal transmitted via the conductor and the measurement signals not being transmitted through the conductor; and
    inferring the signal transmitted via the conductor from the measurement signals, wherein a plurality of signals transmitted via the conductor are inferred from the measurement signals, the plurality of signals including a first signal transmitted in a first direction along the longitudinal coordinate and a second signal transmitted in a second direction opposite the first direction.

7. A device for acquiring at least one signal transmitted via an electric conductor, the device being configured to acquire information concerning the signal transmitted via the conductor by obtaining two measurement signals that represent at least one of: i) an electric field, and ii) a magnetic field, of the conductor, at at least two positions relative to a longitudinal coordinate of the conductor, the measurement signals being different than the signal transmitted via the conductor and the measurement signals not being transmitted through the conductor, and the device being configured to infer, from the measurement signals, the signal transmitted via the conductor, wherein a plurality of signals transmitted via the conductor are inferred from the measurement signals, the plurality of signals including a first signal transmitted in a first direction along the longitudinal coordinate and a second signal transmitted in a second direction opposite the first direction.

8. The device as recited in claim 7, wherein the device is configured to infer, from the measurement signals, a plurality of signals transmitted via the conductor, the plurality of signals including a first signal transmitted in a first direction along the longitudinal coordinate and a second signal transmitted in a second direction opposed to the first direction.

9. The device as recited in claim 7, wherein the device is configured to apply a multidimensional equalization, to infer the signal.

10. The device as recited in claim 7, wherein the device has at least two coupling elements for acquiring the at least one of the electric and the magnetic field, of the conductor at the at least two positions of the conductor.

11. The device as recited in claim 10, wherein the coupling elements include at least one of: i) discrete coupling elements, ii) inductive coupling elements, and iii) capacitive coupling elements.

12. The device as recited in claim 11, wherein the at least one coupling element includes at least one of the following elements: a coil, a capacitor, a coupling line, and an antenna.

13. The method as recited in claim 1, wherein a reconstructed version of the signal transmitted via the conductor is derived from at least one of the measurement signals.

14. The method as recited in claim 6, wherein a reconstructed version of the signal transmitted via the conductor is derived from at least one of the measurement signals.

15. The device as recited in claim 7, wherein a reconstructed version of the signal transmitted via the conductor is derived from at least one of the measurement signals.

16. The method as recited in claim 1, wherein the at least one signal transmitted via the electric conductor includes one of an Ethernet-based communications signal, a CAN (Controller Area Network) signal, and a FlexRay signal.

17. The method as recited in claim 1, wherein the data communication includes one of an Ethernet-based communications signal, a CAN (Controller Area Network) signal, and a FlexRay signal.

18. The device as recited in claim 7, wherein the at least one signal transmitted via the electric conductor includes one of an Ethernet-based communications signal, a CAN (Controller Area Network) signal, and a FlexRay signal.

* * * * *